(12) United States Patent
Wood et al.

(10) Patent No.: US 7,170,059 B2
(45) Date of Patent: Jan. 30, 2007

(54) PLANAR THERMAL ARRAY

(76) Inventors: Roland A. Wood, 150 Mission La. East, Bloomington, MN (US) 55420; Robert E. Higashi, 20220 Manor Rd., Shorewood, MN (US) 55331; Barrett E. Cole, 3010 W. 112th St., Bloomington, MN (US) 55431

( * ) Notice: Subject to any disclaimer, the term of this patent is extended or adjusted under 35 U.S.C. 154(b) by 277 days.

(21) Appl. No.: 10/678,527

(22) Filed: Oct. 3, 2003

(65) Prior Publication Data

US 2005/0072924 A1 Apr. 7, 2005

(51) Int. Cl.
*G01J 5/00* (2006.01)

(52) U.S. Cl. .............. 250/338.1; 250/338.4; 250/370.08; 250/370.09; 438/73

(58) Field of Classification Search .......... 250/338.1, 250/338.4, 370.09, 370.08; 438/73
See application file for complete search history.

(56) References Cited

U.S. PATENT DOCUMENTS

| 3,801,949 | A |  | 4/1974 | Larrabee |
|---|---|---|---|---|
| 4,472,239 | A |  | 9/1984 | Johnson et al. |
| 4,624,137 | A |  | 11/1986 | Johnson et al. |
| 5,034,794 | A |  | 7/1991 | Murotani |
| 5,220,188 | A |  | 6/1993 | Higashi et al. |
| 5,220,189 | A |  | 6/1993 | Higashi et al. |
| 5,286,976 | A |  | 2/1994 | Cole |
| 5,300,915 | A |  | 4/1994 | Higashi et al. |
| 5,420,419 | A |  | 5/1995 | Wood |
| 5,449,910 | A |  | 9/1995 | Wood et al. |
| 5,450,053 | A |  | 9/1995 | Wood |
| 5,554,849 | A | * | 9/1996 | Gates ............... 250/370.08 |
| RE36,136 | E |  | 3/1999 | Higashi et al. |
| 6,046,485 | A |  | 4/2000 | Cole et al. |
| 6,144,285 | A |  | 11/2000 | Higashi |
| 6,313,463 | B1 | * | 11/2001 | Cole et al. ............ 250/338.4 |
| 6,498,347 | B2 | * | 12/2002 | Sauer et al. ........... 250/338.1 |
| 6,806,470 | B2 | * | 10/2004 | Iida et al. ............. 250/338.1 |
| 2001/0025926 | A1 |  | 10/2001 | Mashio et al. |
| 2003/0057372 | A1 |  | 3/2003 | Ilda et al. |
| 2003/0066967 | A1 | * | 4/2003 | Hashimoto et al. ...... 250/338.2 |
| 2005/0030399 | A1 | * | 2/2005 | Suzuki et al. ............ 348/294 |

* cited by examiner

*Primary Examiner*—Renee Luebke
*Assistant Examiner*—Mary Zettl
(74) *Attorney, Agent, or Firm*—Kris T. Fredrick

(57) ABSTRACT

A thermal sensor structure having one level for an infrared detecting pixel including the sensor associated electronics. The electronics displace a small area thereby having little effect on the fill area of the pixel relative to a level having no pixel electronics. That level has thermally isolation for the substrate through the limited structural attachment to the substrate because of the access vias to the silicon. It has additional isolation because of a pit of removed silicon from the substrate below that one level. The thermal sensor may have an array with a large number of pixels having the one level for the pixels and electronics structure.

27 Claims, 17 Drawing Sheets

PLANAR THERMAL ARRAY

BACKGROUND

The invention pertains to infrared light sensitive detectors and particularly to arrays of these detectors. More particularly, it pertains to infrared detector arrays incorporating associated electronics.

Sensitive and small infrared (IR) sensors or thermal detectors may operate on the principles of a thermopile or bolometer. A thermal detector may be an element which is sensitive to temperature changes and can produce an electrical output which may be used to measure changes of temperature of the element. One type of a thermal element may be pyroelectric detector which generates voltages and/or currents in response to changes in temperature. Such sensor may provide a small electrical signal which varies with the relative strength of the infrared radiation impinging on it. This sensor may be used to measure the temperature or change in temperature of an object on which a sensor of this type is focused. Another type of thermal detector, such as a bolometer, may be one whose passive electrical characteristics includes an electrical resistance that changes when the element is subjected to a temperature change. The most sensitive of these types of sensors may detect differences in temperature of a few thousandths of a degree Celsius in the object from which the infrared radiation emanates.

To be able to realize the most of the sensitivity of these infrared sensors, an effective layout, packaging and fabrication may be implemented. Using common photolithographic processes, such sensors may be fabricated in situ in a matrix or array, each sensor forming one of the pixels in the array incorporated in an integrated microcircuit. In general, an integrated microcircuit may have a variety of electrical components that are connected into a desired circuit. Such microcircuits may be made very small. To make such a device as an infrared sensitive solid state imaging device which is small in size, it may be advantageous to combine many thermal detectors within an integrated microcircuit. However, the combining of thermal detector elements within an integrated microcircuit may raise problems due to interfacing the detector elements and associated electronics such as readout circuitry which may need to be in close proximity to the elements to realize their sensitivities. One such problem may arise because the thermal detector elements need to be easily heatable or coolable to enable detection of low level thermal radiation. Therefore, for optimal performance, the thermal detectors may be thermally isolated from their ambient surroundings. That may preclude simply depositing or otherwise mounting the detectors directly on the microcircuit with the associated electronics because the semiconductor material is generally a good thermal conductor. Because of a thermal connection with the electronics, the thermal detectors may be thermally loaded or have much thermal inertia so as to adversely affect their performance in terms of sensitivity and speed.

An example solution to this problem may be a thermal detection device having numerous detectors formed on one surface of a semiconductor substrate. The other surface of the substrate may have one or more openings connecting the two surfaces. Electrical components may be formed on the other surface of the substrate to provide the supporting electronics for the detection device via the one or more openings. A layer of an electrical insulating material having a thermal resistance to the flow of heat along the plane of the layer may be on at least one of the surfaces. An example of a two level thermal sensor may be disclosed in U.S. Pat. No. Re. 36,136, reissued Mar. 9, 1999, entitled "Thermal Sensor", by Robert E. Higashi et al., which is hereby incorporated by reference herein. Another example of a two level thermal sensor may be disclosed in U.S. Pat. No. 6,144,285, issued Nov. 7, 2000, entitled "Thermal Sensor and Method of Making Same," by Robert E. Higashi, which is hereby incorporated by reference herein.

Many objects may emit various amounts of infrared radiation at wavelengths that may differ due to the emissivity, angle of the surface to the viewer, and temperature of the respective objects. Variations in this radiation when impinging on an array of infrared sensor elements may produce corresponding differences in the electrical signals output from the sensor elements in the array. Individual output signals from the sensor elements may be scanned in a sequential manner to form a composite signal collectively encoding an image of the field of view showing the objects which are the sources of the infrared radiation. The resulting image may be presented in real time and be used to form a visible image in a display which represents the spatial relationship of the objects in the field of view. The electronic circuitry may scan and amplify the signals from the individual sensor elements to provide a signal which may be used to reproduce the field of view on a screen.

Another example of an infrared sensor device, depending on a thermoelectric mechanism to provide the signal voltage output, may have thin layers of conductive materials of various types and insulating material which may be deposited in appropriate patterns on a silicon sensor substrate using photolithographic techniques. Thermoelectric junctions may be formed by overlapping conductors during the deposition. Such sensors may be referred to as microbridge sensors. The junctions of these microbridge sensors may be of two kinds, sensor junctions and reference junctions. The reference junctions may be in close thermal contact with the substrate. Each sensor junction may be within a small, discrete area which overlays a pit or depression formed in the sensor substrate, and may be of an area conforming to a footprint of the sensor junction. From a cross sectional view, these sensors may look much like a bridge spanning a valley, hence the term "microbridge". The pits may provide a measure of thermal isolation from the substrate for their associated sensor junctions. Thus, changing infrared radiation impinging on both the sensor and reference junctions may result in the temperature of the sensor junction to change more rapidly than that of the reference junction, resulting in a temperature differential between the junctions which generates a signal. The photolithographic techniques may allow individual sensors to be fabricated in an array so as to allow imaging of the infrared radiation in a field of view. Leads from the elements forming the junctions may be led to electronic circuitry formed in another layer below the sensor substrate.

For maximum sensitivity, microbridge sensors may be maintained in a low pressure gas atmosphere or in a vacuum by virtue of reduced heat transfer between the sensing junction and the substrate, but this may require a hermetically sealed enclosure which adds cost and reduces reliability. It may also be possible to use a less tightly sealed enclosure containing air or other gas at or near atmospheric pressure, at the cost of less sensitivity. The microbridge sensor elements may be designed to produce a usable signal with a few hundredths or thousandths of a degree Celsius temperature differential between the sensing and reference junctions. One application for these sensors may be in arrays for forming images of relatively low contrast scenes or fields of view, such as may arise indoors in occupied rooms. In such fields of view, the inanimate, non-heat producing objects may all be very nearly at the same temperature. Distinguishing such objects by use of infrared imaging may require such sensitive sensors.

As noted above, infrared sensor elements in two dimensional arrays may be conventionally fabricated using two surfaces of a substrate or using a two-level structure in which the infrared absorbing or sensor elements are on a level different from the level of the associated and/or supporting electronics, such as monolithic readout circuits. Making the infrared detection system as a multi-level or multi-surface structure adds cost to the fabrication process. The present invention provides a significantly less costly, simpler and fewer-step single level approach with better yields, for fabricating an infrared sensor system having as good of performance, than other structural approaches such as the ones noted above.

SUMMARY

The invention may be a two dimensional microbolometer array system in which the infrared absorbing structure and monolithic readout circuits are on a common level and surface, resulting in a low cost fabrication process relative to a multi-level or multi-surface system. In this system, one or more of low-area field effect transistors (FETs) may be fabricated in a silicon wafer, resulting in a significant portion of the regions of silicon remaining empty of circuits to provide room for infrared sensor elements having as good of a fill factor than the multi-level or multi-surface sensor systems. Multiplexing circuits may be placed at the periphery of the array, but these do not need be low-area. A layer of thermally-sensitive material may be deposited on the surface, for example, alpha silicon, polysilicon, vanadium oxides, polymers, pyroelectrics and ferroelectrics. As needed, a supporting dielectric layer may be added to provide strength to the structure. Metals may be deposited to provide infrared absorbing properties for elements. Also, the depositing of metals may provide electrical contacts for the monolithic electronics. Next, an etch process may be used to remove the underlying silicon in the areas where no monolithic electronics are present, leaving planar thermally-isolated bridges. Appropriate patterning, depositing and etching may result in putting infrared sensor elements on these bridges.

DESCRIPTION

Figure 1:
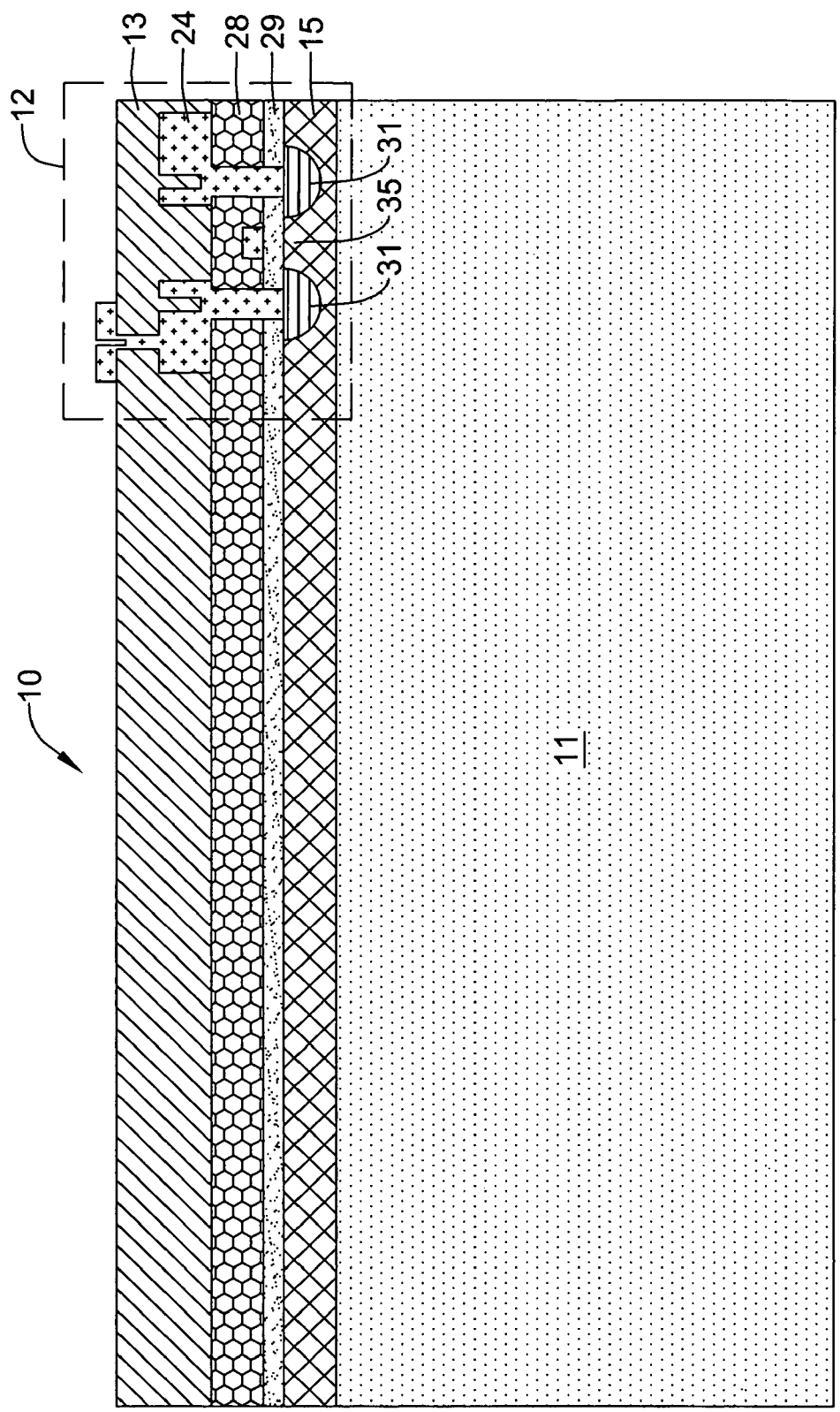
FIG. 1 is a cross section view of a substrate with a number of layers for a fabrication of an infrared sensitive detector and an electronics section at one edge of the substrate.
Figure 2:
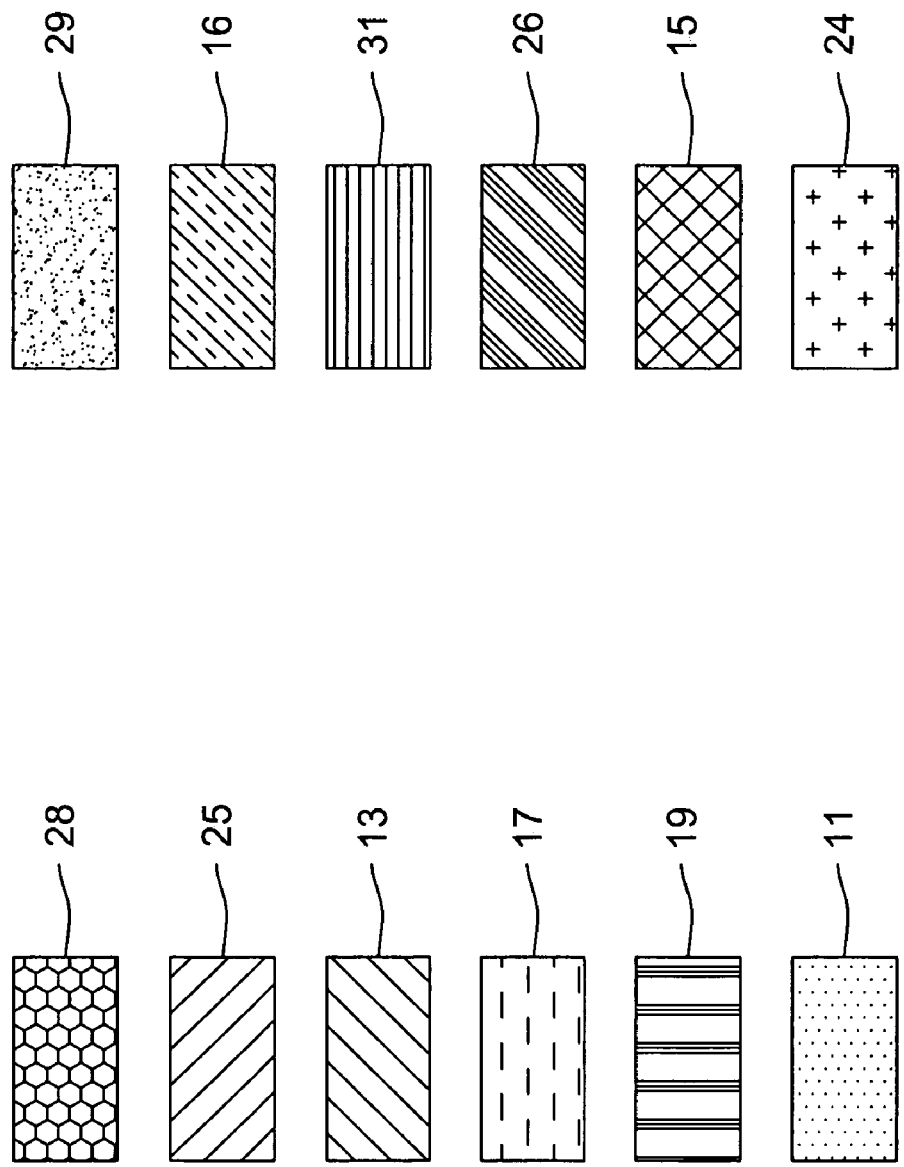
FIG. 2 is a set of graphical symbols used in some of the figures.
Figure 3:
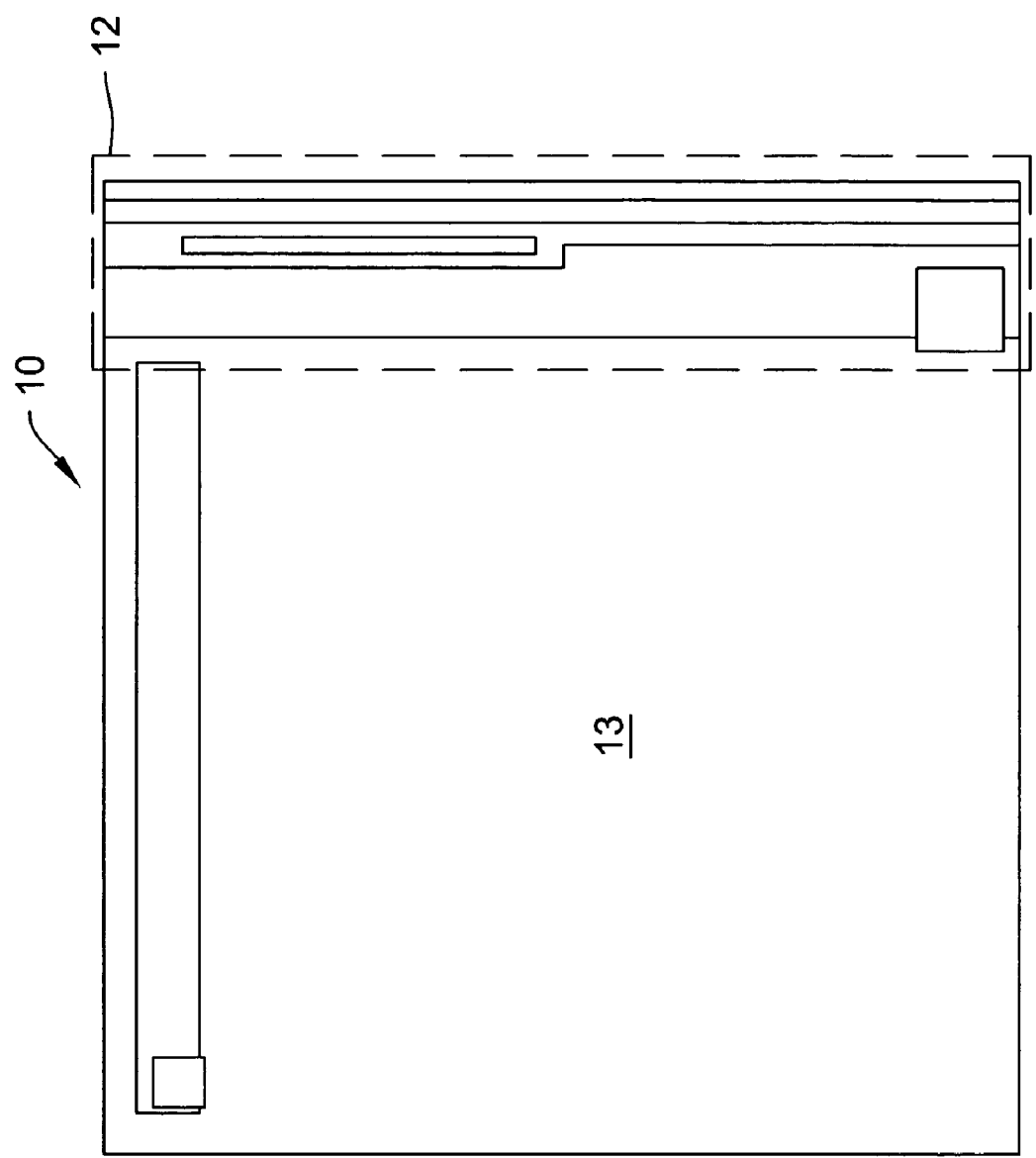
FIG. 3 is a top view of the substrate in FIG. 1.

A cross-sectional view of a structure 10 shows readout electronics 12 for a pixel fabricated on a silicon (100) substrate 11, in FIG. 1. Electronics 12 may contain small-area field effect transistors (FETs) 31 that take up relatively little room on substrate 11 thereby resulting in pixel fill factor that is nearly the same as if the readout electronics were not on the same level as the pixel. Items 31 represent a drain and source of a FET. Portion 35 between the drain and the source portions 31 is a drain of the FET. Electronics 12 may be processed on silicon substrate 11 in the form of complimentary metal oxide semiconductor (CMOS) circuitry. Electronics 12 may instead include bipolar transistor circuitry. Electronics 12 may also incorporate other small area technologies. FIG. 2 is a table of graphical symbols that may be utilized with FIG. 1 and other cross-sectional figures to aid in the identification of materials. FIG. 3 is a top plan view of structure 10 further showing the location readout electronics 12 on the structure. FIGS. 1 and 3 do not fully emphasize the smallness of the electronics relative to the pixel. The size for electronics 12 may be exaggerated so that some of the detail of electronics 12 may be discernable in the figures. The fill factor (i.e., the ratio of the pixel receptive area relative to the total area of structure 10) of the present one-level thermal pixel 18 may be greater than 70 percent. The area of electronics 12 may depend on layout configuration which would include a portion of one dimension of structure 10 and the full portion of the other dimension. The two level thermal pixel may have no better fill factor because of the area needed for connections to the pixel sensitive area from the electronics form the other level. Top view FIGS. 3, 5, 8, 10 and 16 is not necessarily drawn to scale.

Figure 4:
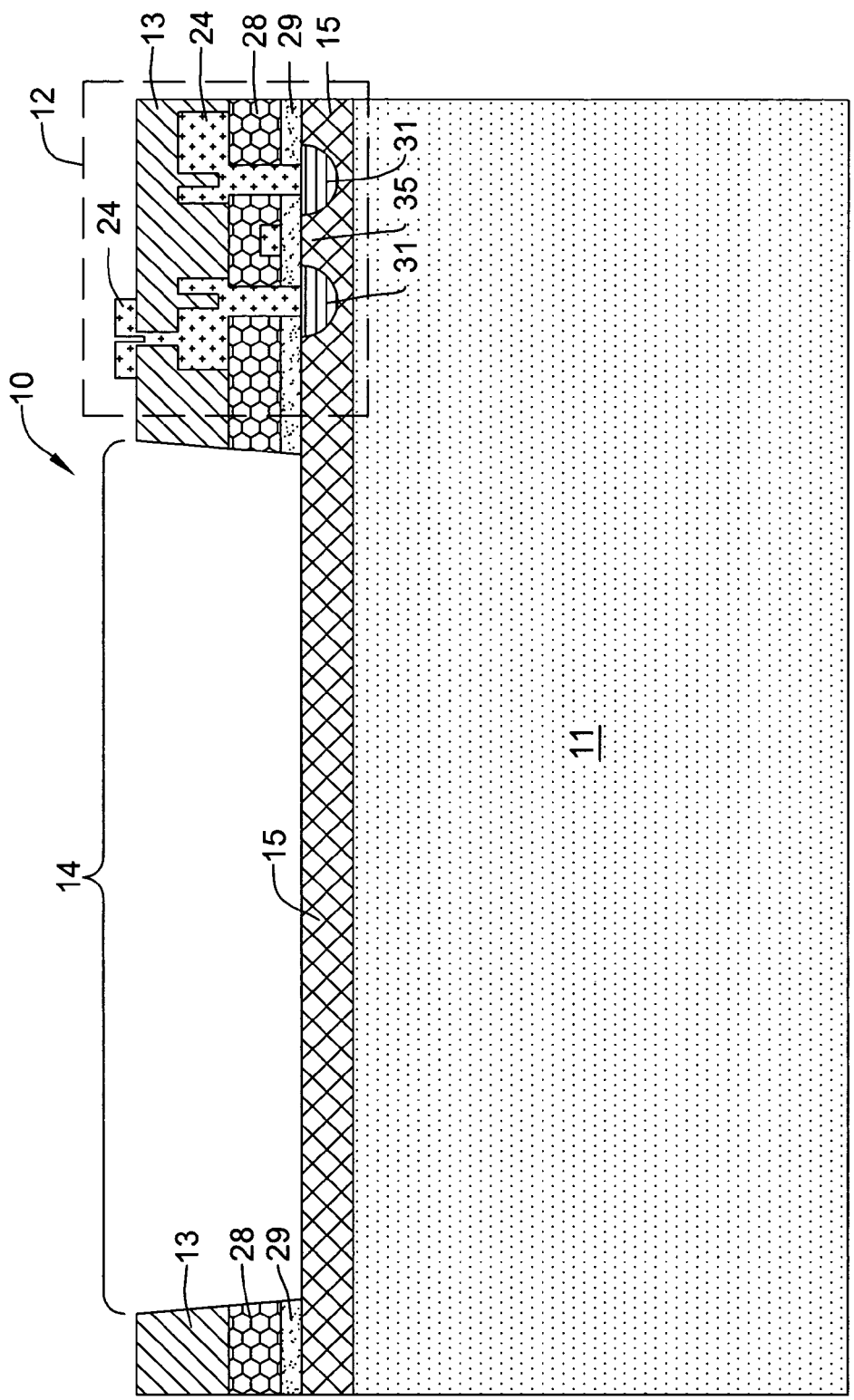
FIG. 4 reveals an etched-out pixel region.

A portion of passivation layers 13, 28 and 29 may be cut and removed from a pixel region 14 down to the top of layer 15, as shown in FIG. 4. The material of layers 13, 28 and 29 may be a material such as $SiO_2$ which may be applied in various ways. Other material materials may be appropriate for layers 13, 28 and 29.

Figure 5:
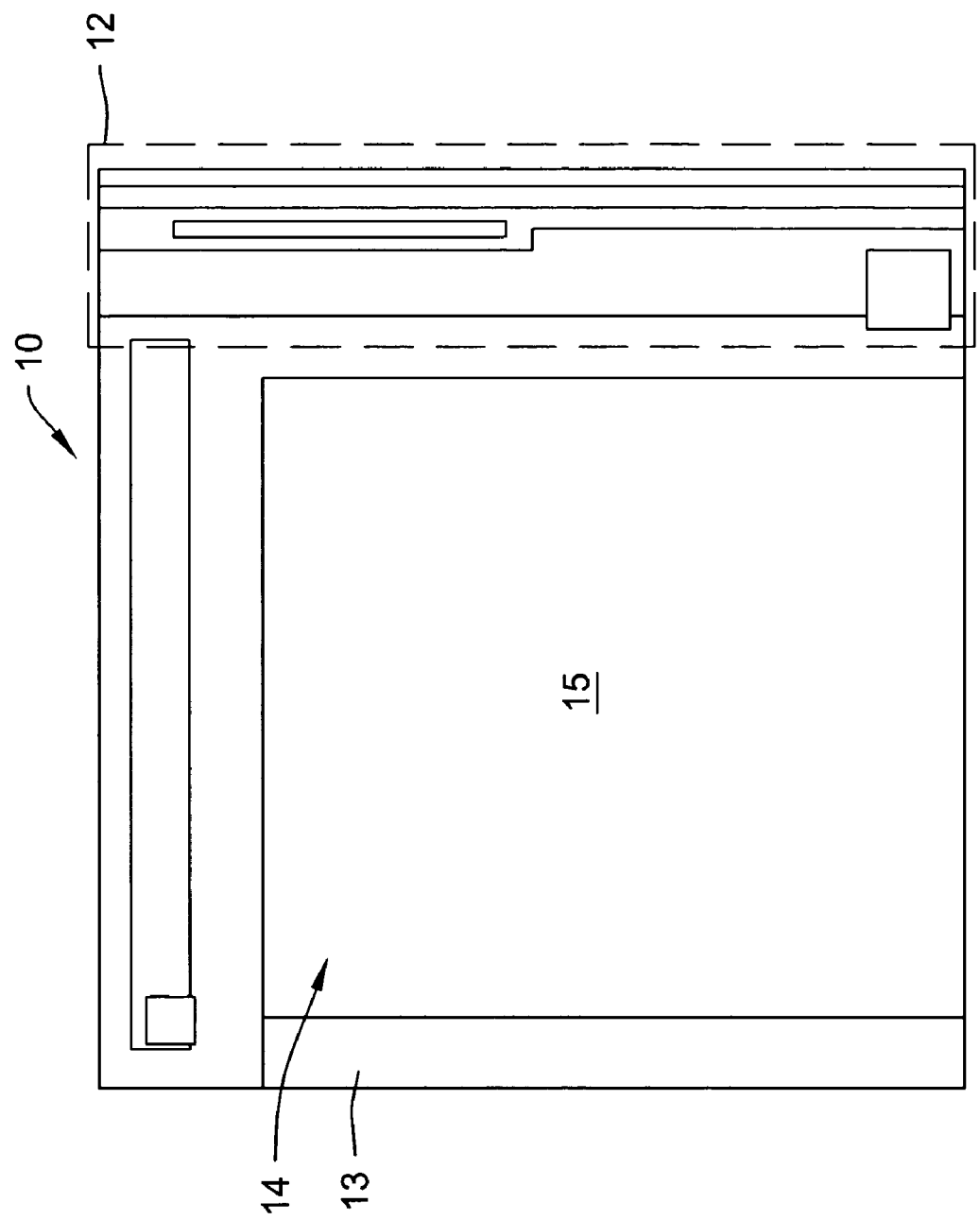
FIG. 5 is a top view of the structure in FIG. 4.
Figure 6:
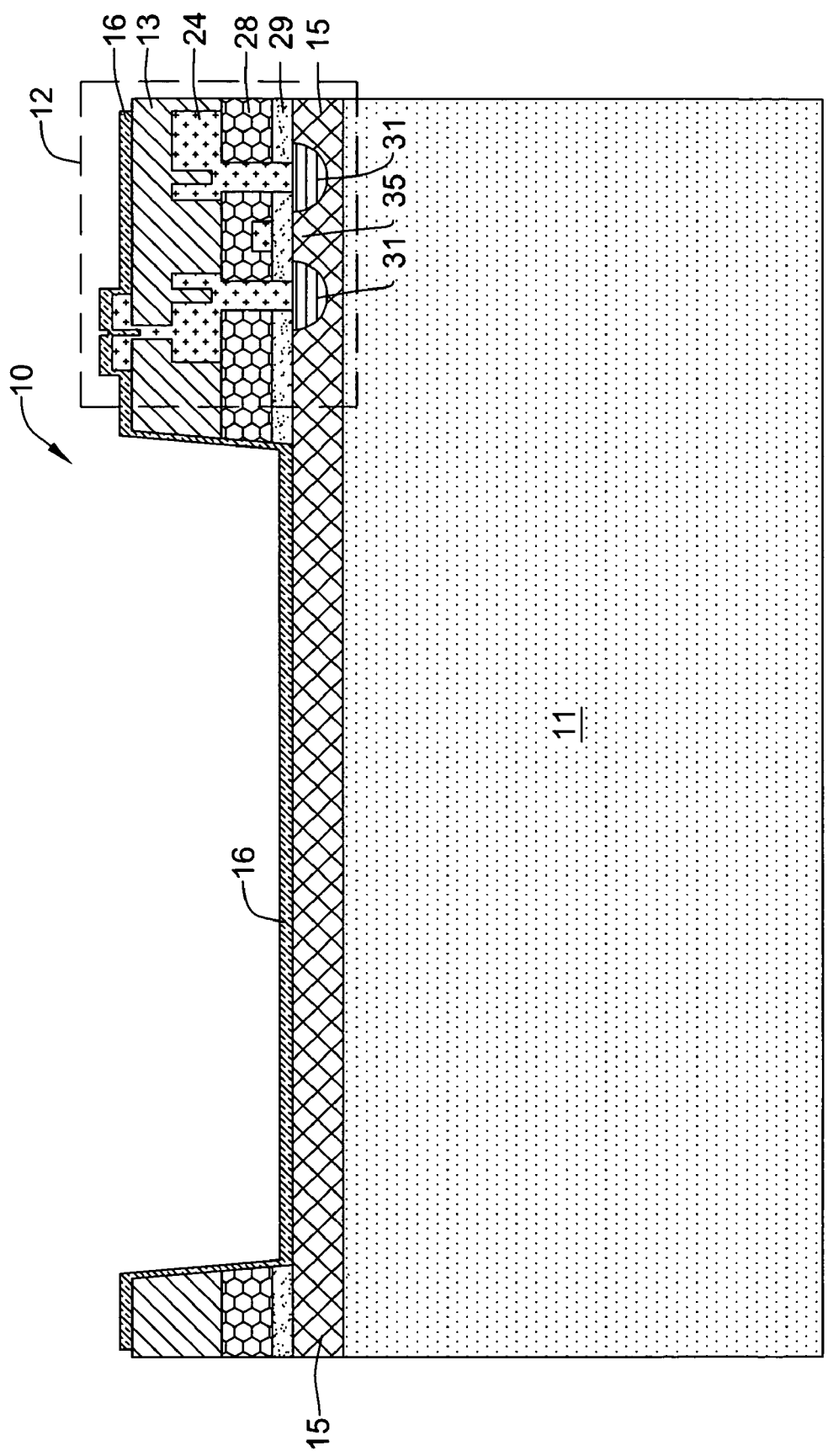
FIG. 6 shows a bottom bridge dielectric deposited in the pixel region on the thermal sensor structure.
Figure 7:
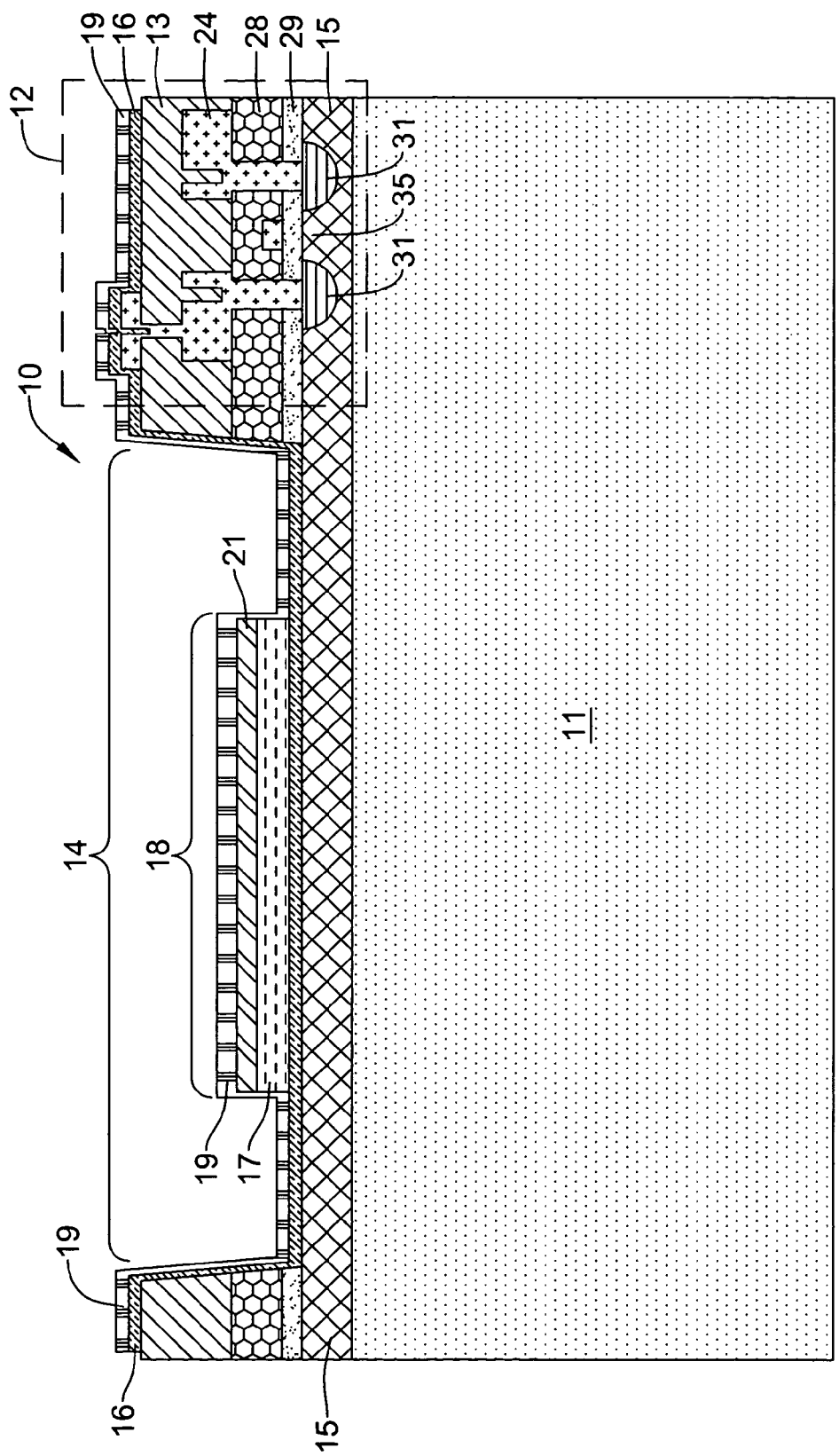
FIG. 7 shows the fabrication of a pixel area on the bottom bridge dielectric.
Figure 8:
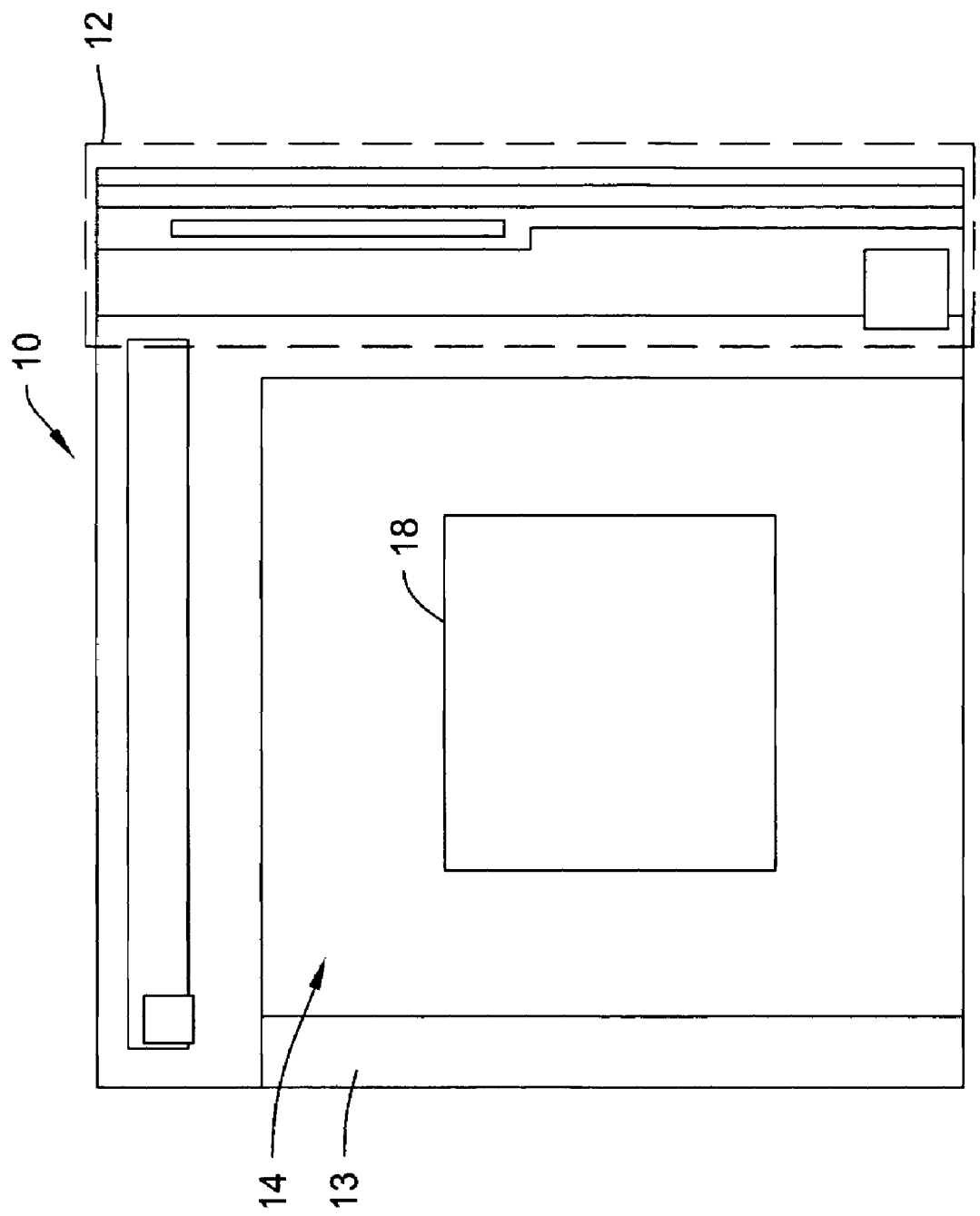
FIG. 8 is a top view showing the location of the pixel area in the pixel region.
Figure 9:
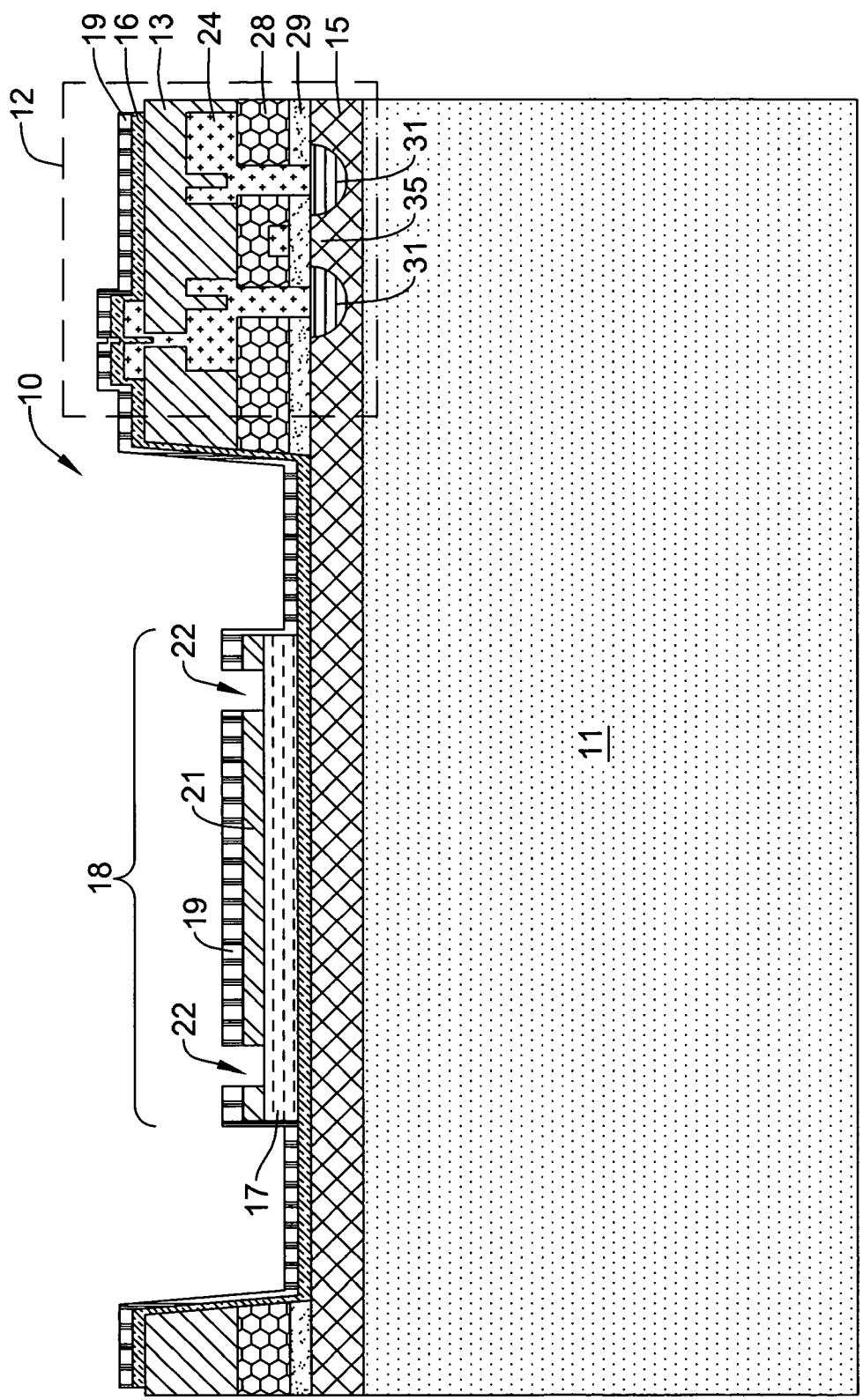
FIG. 9 reveals the contact vias for the pixel area.
Figure 10:
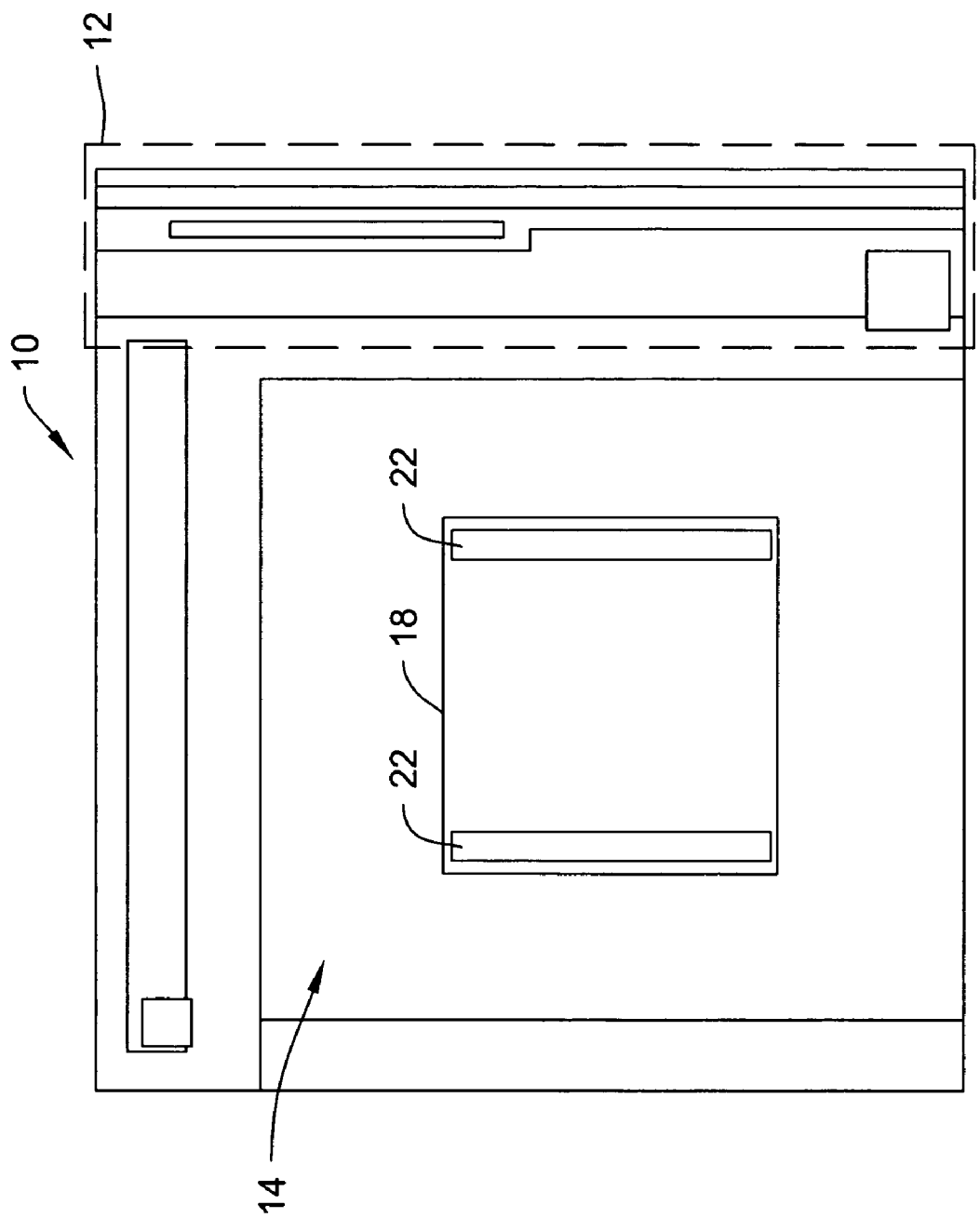
FIG. 10 shows a top view of the contact vias.

Layer 15 may be epitaxial silicon or like material. FIG. 5 shows region 14. Region 14 may have material 15 exposed at this stage of fabrication. A bottom bridge dielectric 16 may be deposited on top of structure 10 including material 15 in region 14, as shown in FIG. 6. Dielectric 16 may be $Si_3N_4$. Other materials may be used as dielectric 16. With a pattern, a $VO_x$ (vanadium oxide) material 17 may be deposited on the middle of pixel region 14 to form a pixel area 18 with a layer of material 21 on top of material 17, as shown in FIG. 7. Other materials that have a resistance change relative to temperature change may be used in lieu of the $VO_x$. A passivation layer 19 may be deposited on top of structure 10, covering material 21 on pixel area 18 and material 16 on the remaining portion of structure 10 including pixel region 14. Layer 19 may be $Si_3N_4$ or other appropriate material. Material 21 may be deposited on layer 17. FIG. 8 reveals pixel 18 as it is situated on pixel region 14. Contact vias 22 may be cut through passivation layers 19 and 21 down to $VO_x$ layer 17, as shown in FIG. 9. A plan view in FIG. 10 shows the location of vias 22 in pixel area 18. Alternatively, vias 22 might be cut with a different orientation relative to electronics 12.

Figure 11:
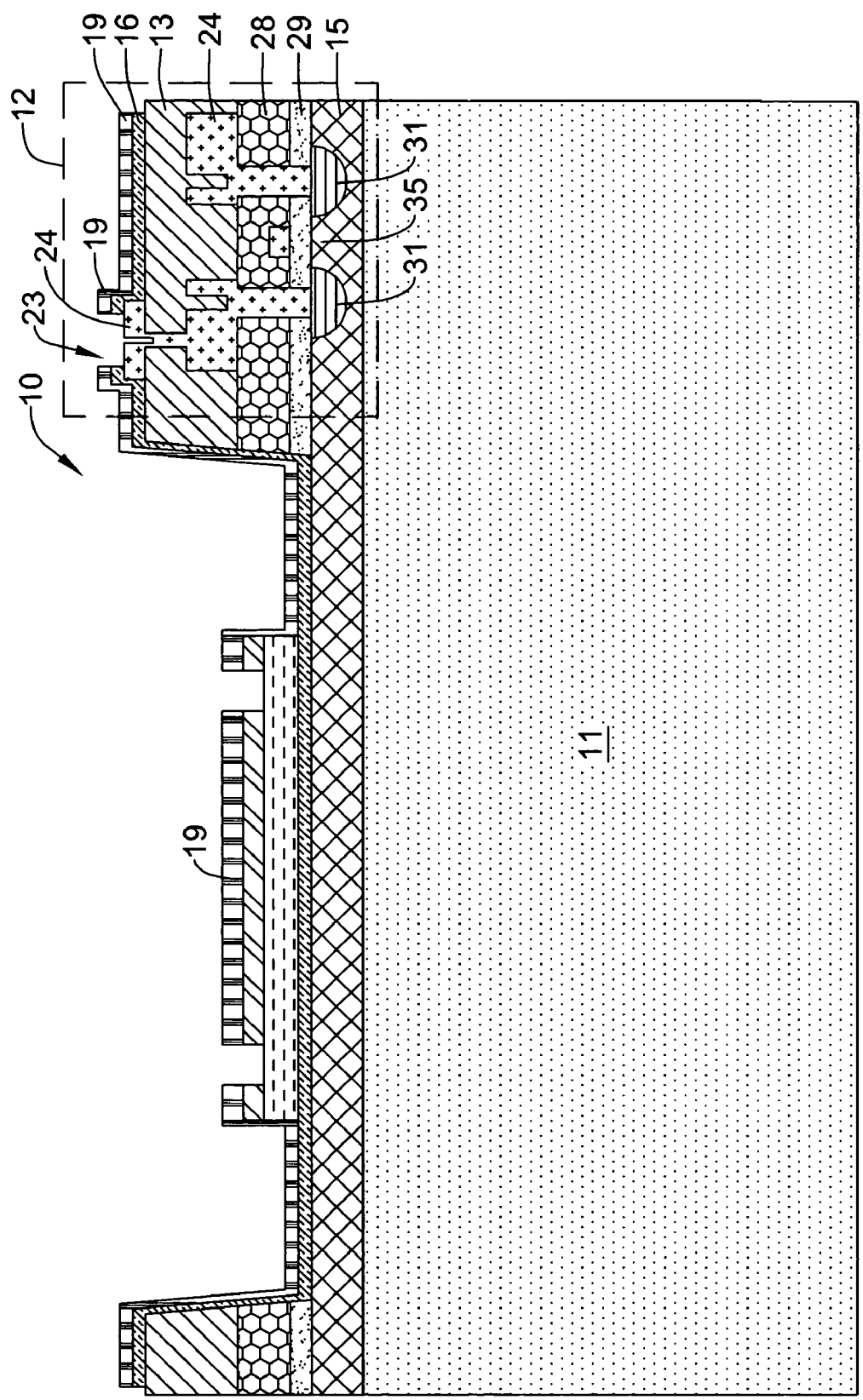
FIG. 11 illustrates a contact via for the electronics of the sensor.
Figure 12:
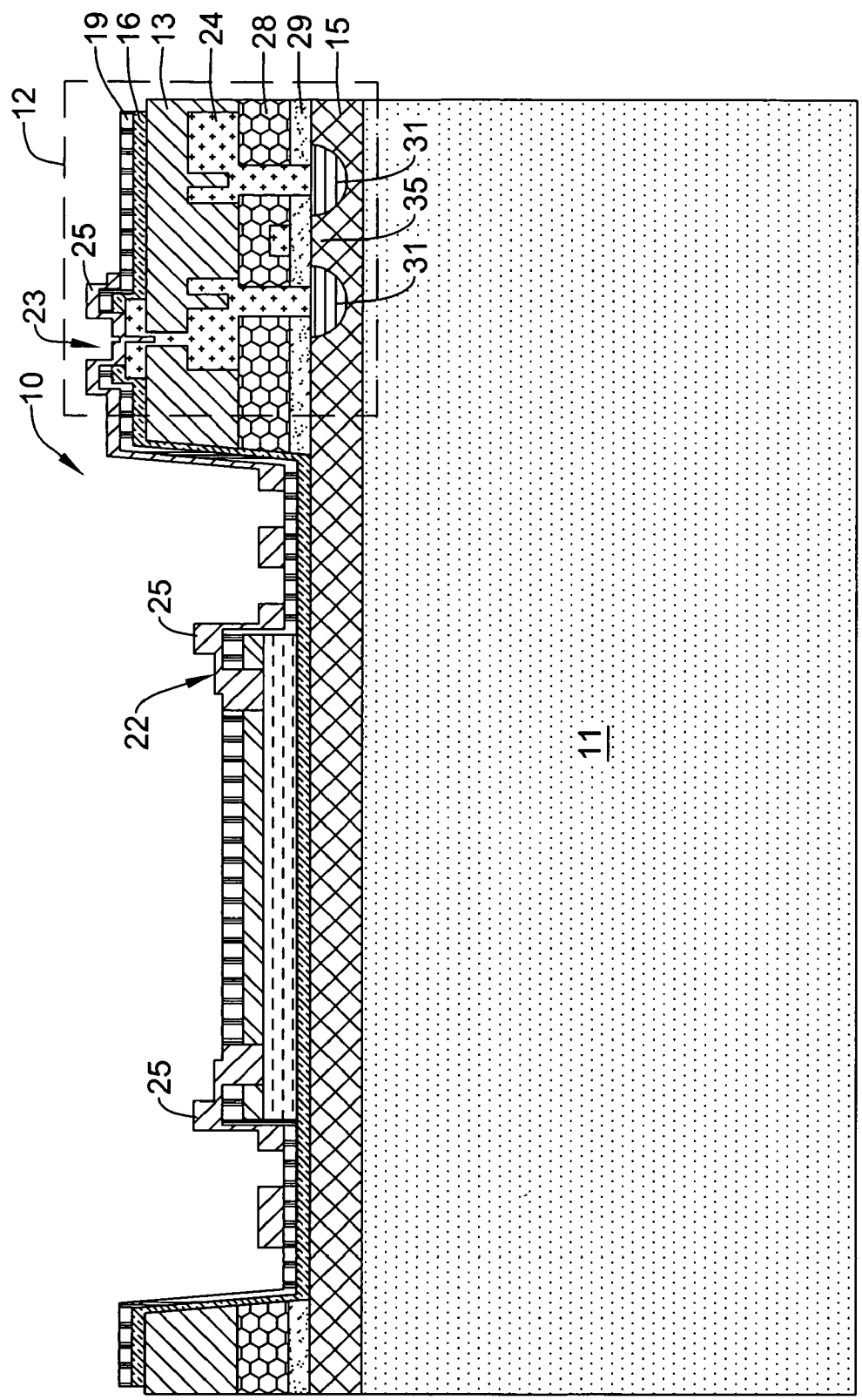
FIG. 12 shows a patterned metallization layer applied on the structure for electrical contact through the vias to the pixel area and the electrics.
Figure 13:
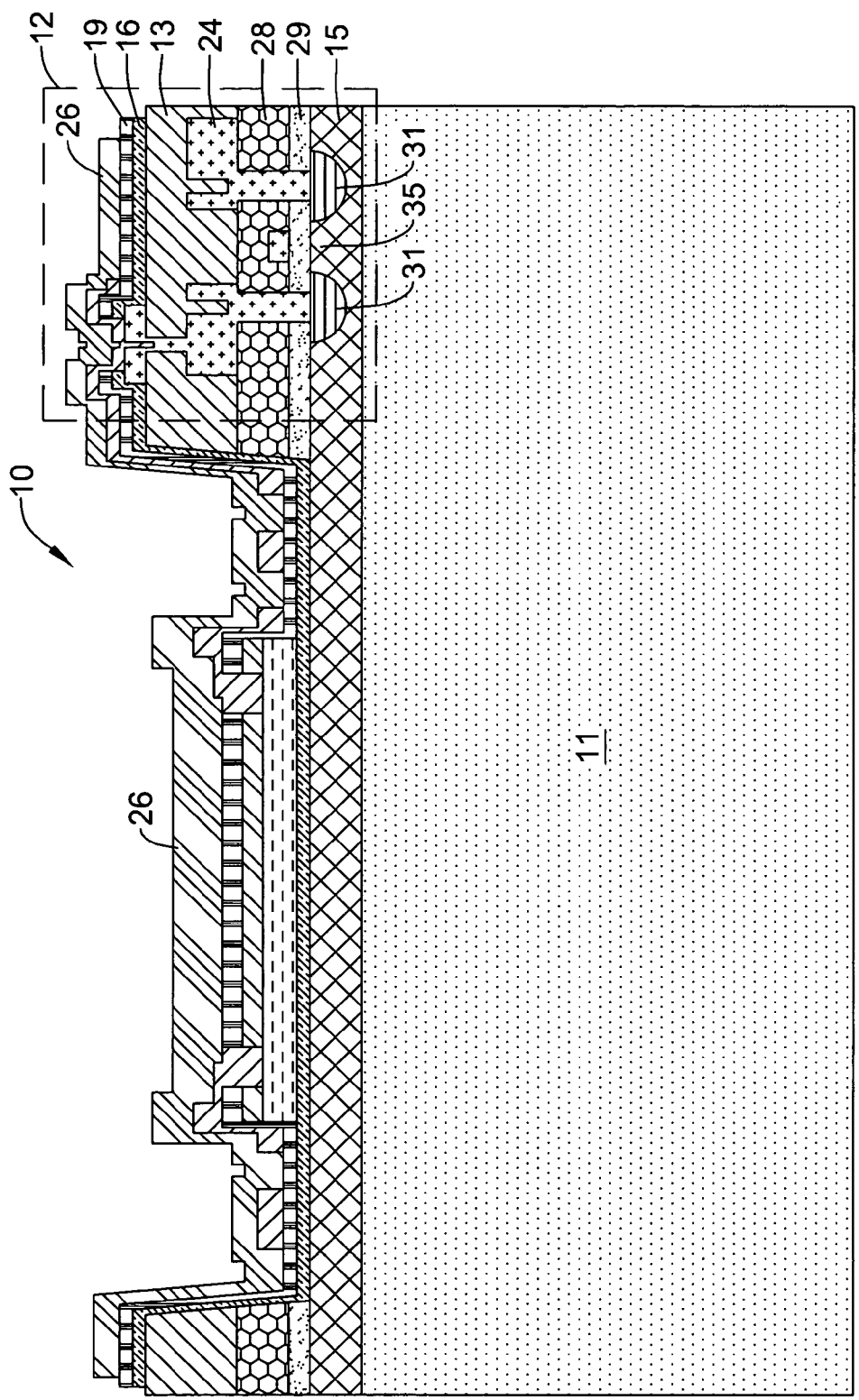
FIG. 13 shows sensor structure with a passivation layer applied on it.

At least one contact via 23 may be cut through passivation layers 16 and 19 to a top metallization 24 of CMOS electronics 12, as indicated in FIG. 11. Metallization 24 may be aluminum or other appropriate material. Contact metal 25 may be deposited on metallization 24 and on rest of structure 10. Metal 25 may be NiCr or like material. Prior to the deposition of metal 25, a pattern may be applied on structure 10 allowing for other places besides electronics 12 that may need electrical conductors. Also the pattern may prevent material 19 of pixel area 18 from being covered with directly contacting metal 25. Contact may be made to $VO_x$ layer 17 through via 22 and to top metallization 24 through via 23, as shown for example in FIG. 12. A passivation layer 26 may be deposited on the top of structure 10 as shown in FIG. 13. Layer 26 may be $Si_3N_4$ or similar material.

Figure 14:
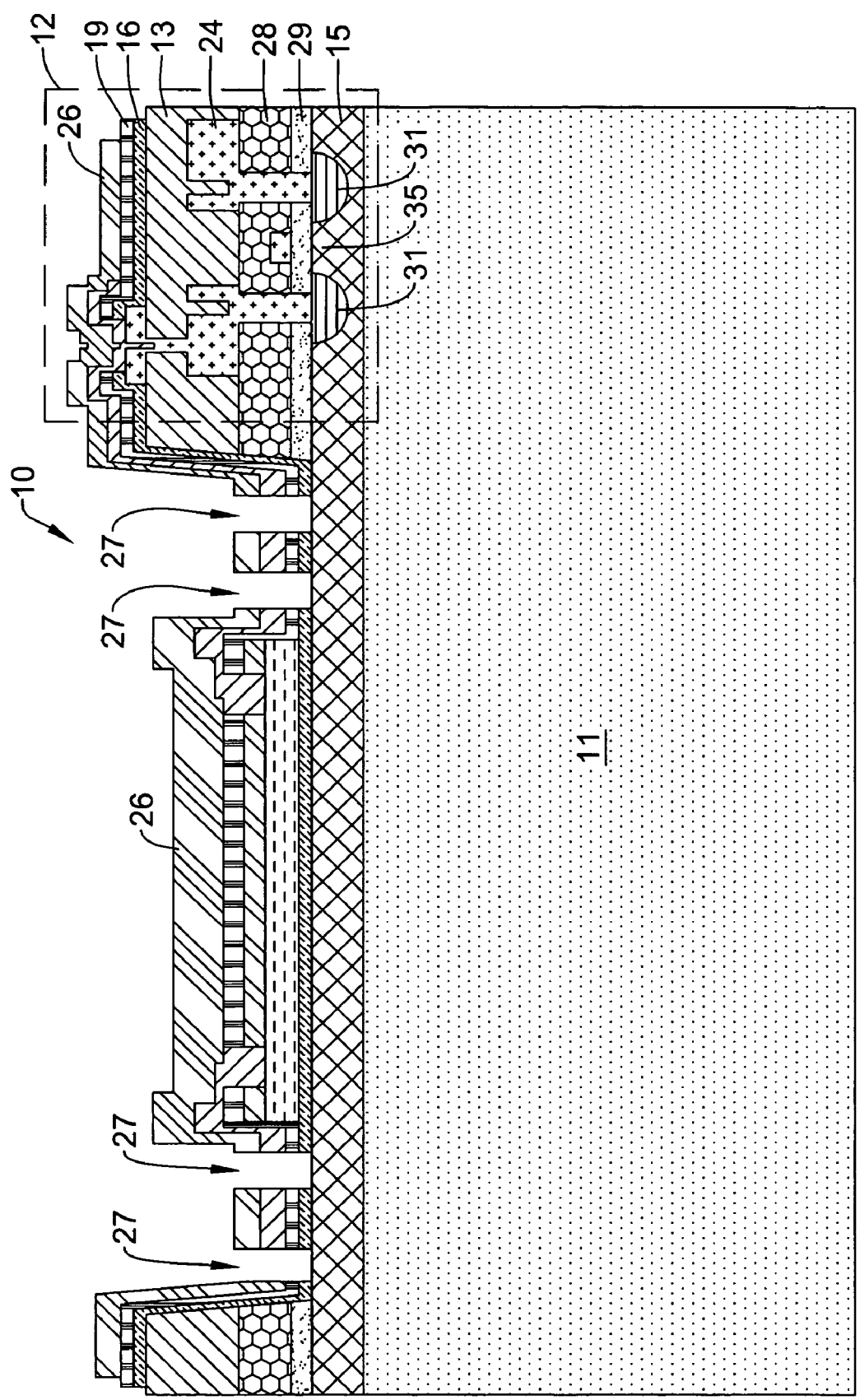
FIG. 14 reveals etched vias from the top of the sensor structure to the epitaxial silicon layer formed directly on the substrate.
Figure 15:
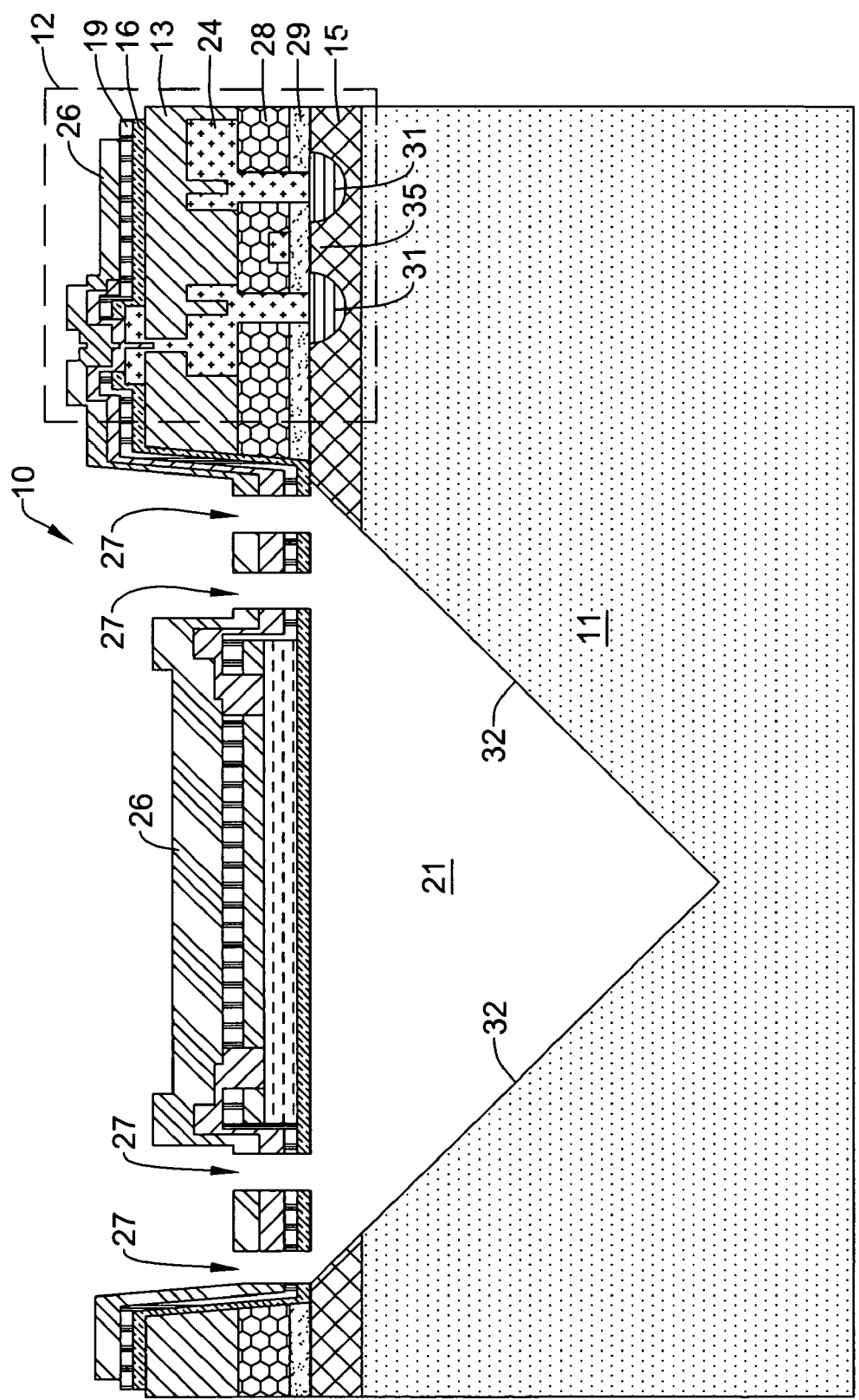
FIG. 15 illustrates the vias into the substrate and the removal of a portion of the substrate to form a pit beneath the pixel area for thermal isolation.
Figure 16:
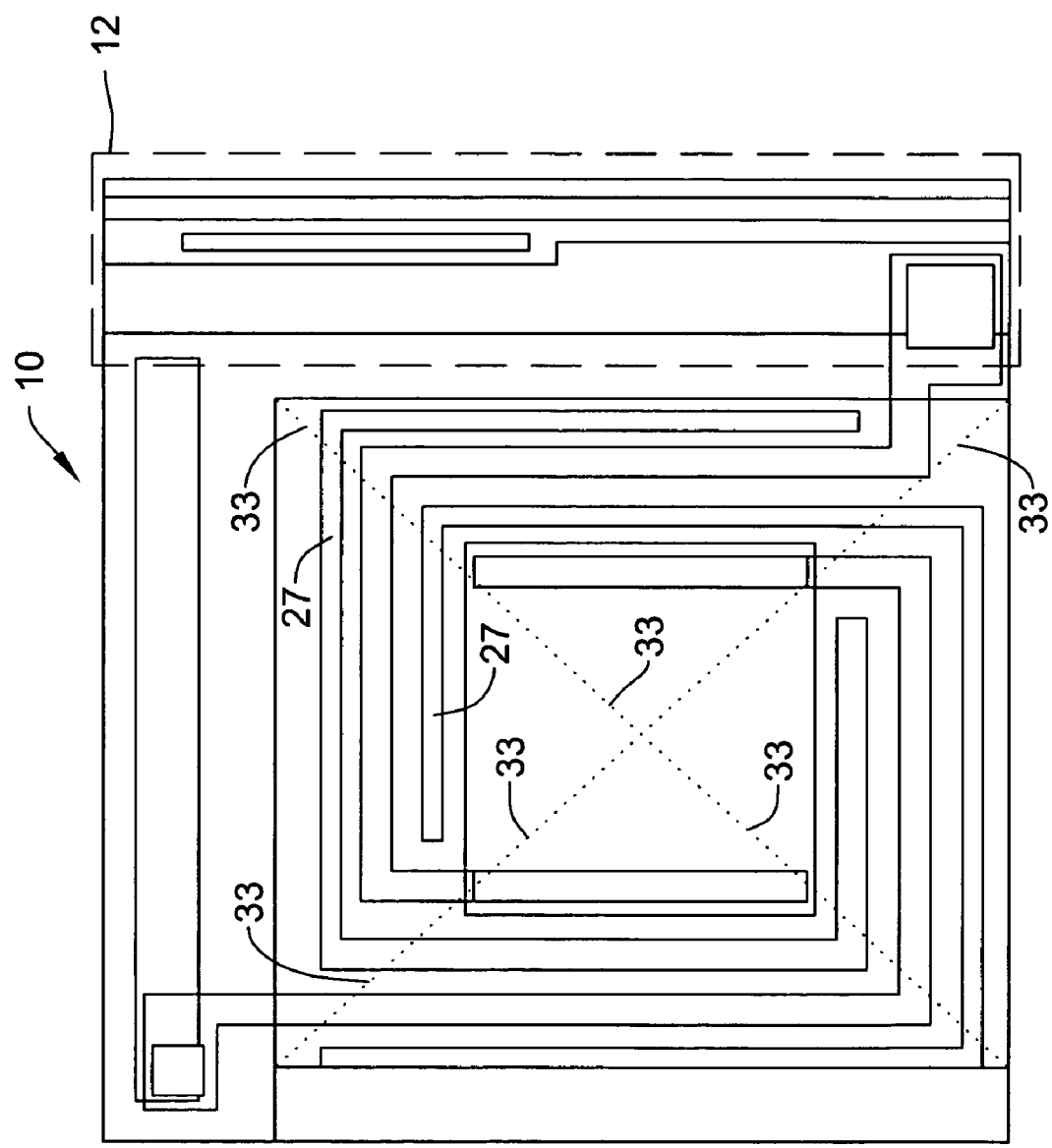
FIG. 16 is a top view of revealing the design of the vias which provide access to the substrate from the top of the structure and improve thermal isolation of the pixel area.

The pixel region 14 structure may be patterned and etched for access to silicon substrate 11 through vias 27, as in FIG. 14. A KOH etch may be done through vias 27 to remove material from silicon substrate 11. This removal of material from substrate 11 may form a pit 21 below pixel 18 thereby releasing pixel 18 from substrate 11, as revealed in FIG. 15. Pit 21 may provide thermal isolation of pixel 18 from substrate 11. Pit 21 may be like an upside down pyramid having sides 32 with corner edges 33. In FIG. 16, vias 27 show the thermal isolation of pixel 18 relative to substrate 11. Edges 33 of the pyramid shape pit 21 may be represented by dotted lines where the edges are hidden from view in FIG. 16 by structure 10 material. However, edges 33 may be represented by solid lines when not block from view by material such as at vias 27.

Figure 17:
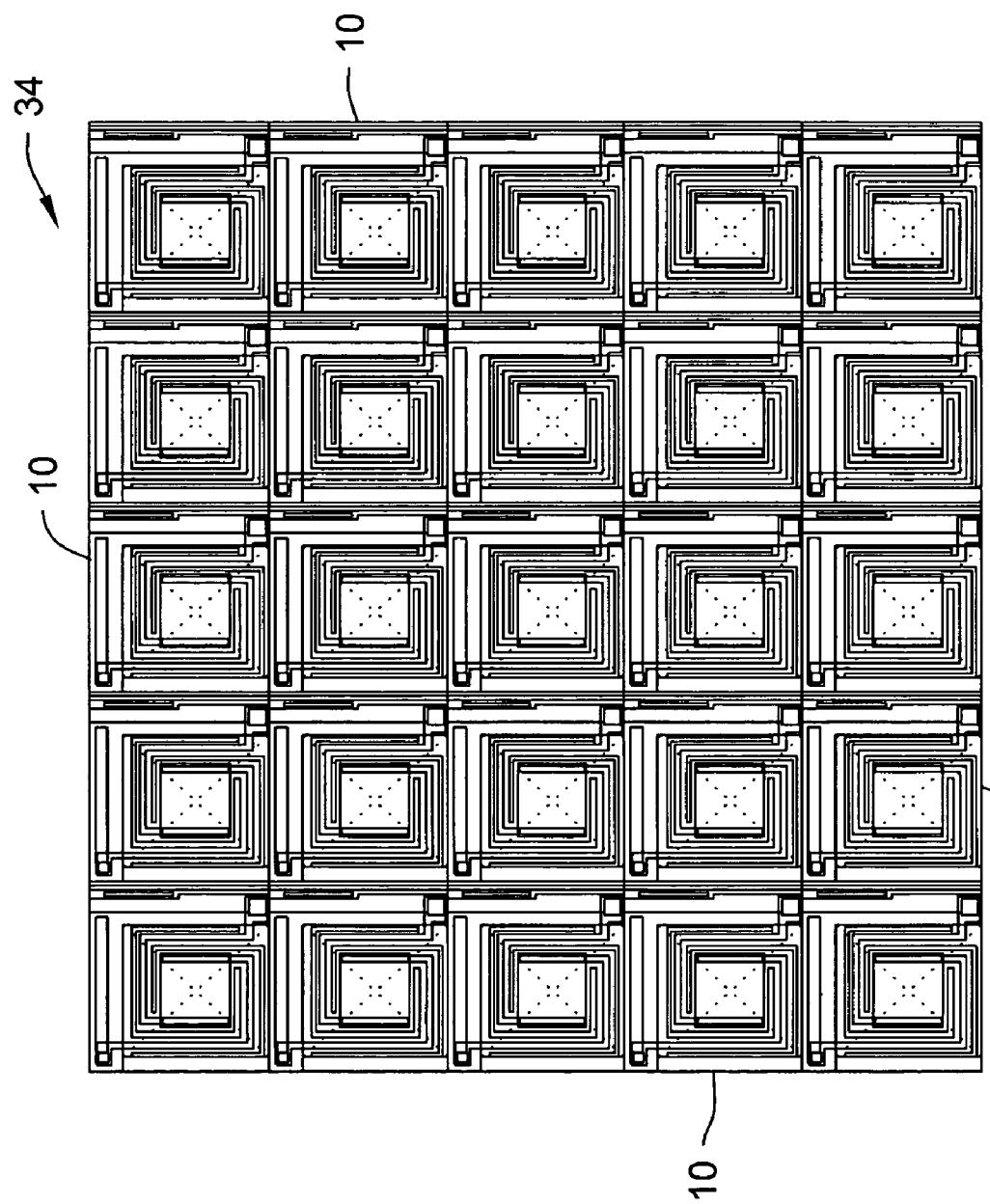
FIG. 17 shows an array of sensor structures.

There may be a large number of sensor structures 10 forming an array 34 on a chip. The pixel supporting electronics may be located close to each pixel to maintain sensitivity of the pixel. This configuration of pixels may be shown as an array in FIG. 17. The electronics of the pixels in an array may instead be situated on the chip in essentially one location.

Although the invention has been described with respect to at least one illustrative embodiment, many variations and modifications will become apparent to those skilled in the art upon reading the present specification. It is therefore the intention that the appended claims be interpreted as broadly as possible in view of the prior art to include all such variations and modifications.

What is claimed is:

1. A sensor comprising:
   a substrate;
   a pixel situated on a single level on the substrate; and
   an electronics circuit situated on the single level, wherein the pixel has a fill factor greater than 69 percent.

2. The sensor of claim 1, wherein the pixel is an infrared light detector.

3. The sensor of claim 2, wherein the substrate has a pit proximate to the pixel.

4. The sensor of claim 3, wherein the pixel has at least one via in the one level supporting the pixel.

5. The sensor of claim 4, wherein the electronics circuit comprises a FET circuit.

6. The sensor of claim 5, wherein the electronics circuit comprises at least one small area FET, leaving a significant portion of the substrate free of circuits.

7. The sensor of claim 6, wherein the electronics is CMOS circuitry.

8. The sensor of claim 7, wherein the pixel is a microbolometer.

9. The sensor of claim 4, wherein the electronics comprises a bipolar transistor circuit.

10. A thermal sensor comprising:
    a substrate; and
    an array of pixels situated on the substrate; and
    wherein:
    each pixel is located on a single level;
    an electronic circuit is associated with each pixel;
    each electronic circuit is located on the single level with the pixel; and
    the pixels have a fill factor greater than 69 percent.

11. The sensor of claim 10, wherein each pixel is an infrared light detector.

12. The sensor of claim 11, wherein each pixel is suspended over a pit in the substrate.

13. The sensor of claim 12, wherein each electronic circuit is CMOS FET circuitry.

14. The sensor of claim 13, wherein each pixel is a microbolometer.

15. A sensing means comprising:
    means for sensing infrared light;
    means for electronically processing signals related to infrared light sensed by the means for sensing infrared light; and
    means for supporting on one level the means for sensing infrared light and the means for electronically processing signals, wherein the means for electronically processing signals has an area that is significantly smaller than the area of the means for sensing infrared light.

16. The means of claim 15, wherein the means for supporting on one level supports the means for sensing infrared light over a thermal isolating opening.

17. The means of claim 16, wherein the means for sensing infrared light is an array of pixels.

18. The means of claim 17, wherein:
    each pixel of the array of pixels is a microbolometer pixel comprising $VO_x$; and
    the means for electronically processing signals is small area transistor circuitry that leaves a significant portion of the means for supporting free of circuits.

19. The means of claim 18, wherein the small area transistor circuitry is CMOS FET circuitry.

20. The means of claim 19, wherein:
    the means for supporting on one level is a planar level substrate; and
    the thermal isolating opening is a pit in the substrate under each pixel of the array of pixels.

21. A sensor comprising:
    a substrate;
    a pixel situated in a first plane relative to a surface of the substrate; and
    an electronics circuit situated in the first plane; wherein the pixel has a fill factor greater than 69 percent.

22. A thermal sensor comprising:
    a substrate; and
    an array of pixels situated on the substrate; and wherein:
each pixel is located on a first surface;
an electronic circuit is associated with each pixel;
each electronic circuit is located on the first surface proximate to the pixel; and
each pixel has a fill factor greater than 69 percent.

23. A thermal sensor comprising:
a substrate; and
an array of pixels situated on the substrate; and
wherein:
an electronic circuit is associated with each pixel; and
each electronic circuit is situated horizontally proximate to the pixel; wherein the pixels have a fill factor greater than 69 percent.

24. A thermal sensor comprising: a substrate; and
an array of pixels situated on the substrate; and
electronics situated on the substrate horizontally proximate to the array of pixels; wherein each pixel has a fill factor greater than 69 percent.

25. A sensing means comprising:
means for sensing infrared light;
means for electronically processing signals related to infrared light sensed by the means for sensing infrared light; and
means for supporting on one surface the means for sensing infrared light and the means for electronically processing signals; wherein the means for electronically processing signals has an area that is significantly smaller than the area of the means for sensing infrared light.

26. A sensing means comprising:
means for sensing infrared light;
means for electronically processing signals related to infrared light sensed by the means for sensing infrared light; and
means for supporting the means for sensing infrared light and the means for electronically processing signals horizontally proximate to each other; wherein the means for electronically processing signals has an area that is significantly smaller than the area of the means for sensing infrared light.

27. A sensing means comprising:
means for sensing infrared light;
means for electronically processing signals related to infrared light sensed by the means for sensing infrared light; and
means for supporting in a plane the means for sensing infrared light and the means for electronically processing signals; wherein the means for electronically processing signals has an area that is significantly smaller than the area of the means for sensing infrared light.

* * * * *